(12) United States Patent
Chen et al.

(10) Patent No.: US 7,501,875 B1
(45) Date of Patent: Mar. 10, 2009

(54) HIGH FREQUENCY DIFFERENTIAL VOLTAGE LEVEL SHIFTER

(75) Inventors: David Jia Chen, Endwell, NY (US);
William Frederick Lawson, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/863,633

(22) Filed: Sep. 28, 2007

(51) Int. Cl.
*H03L 5/00* (2006.01)

(52) U.S. Cl. .............................. 327/333; 326/62; 326/81

(58) Field of Classification Search ................. 327/333; 326/62, 63, 80–84
See application file for complete search history.

(56) References Cited

U.S. PATENT DOCUMENTS 7,132,857 B2 * 11/2006 Jurek .......................... 326/82

* cited by examiner

*Primary Examiner*—An T Luu
(74) *Attorney, Agent, or Firm*—Wood, Herron & Evans, LLP

(57) ABSTRACT

A design for a high speed differential voltage level shifter circuit arrangement utilizes both PFETs and NFETs controlled by inputs to determine the state of the outputs, which minimizes or eliminates contention on internal nodes when switching from one state to another. As a result, the design minimizes the adverse affects of mismatched NFET and PFET device strengths, and facilitates usage at high frequencies and for level shifting to a range of output voltage levels. The design is also adaptable for use in level shifting to higher or lower output voltages.

9 Claims, 1 Drawing Sheet

HIGH FREQUENCY DIFFERENTIAL VOLTAGE LEVEL SHIFTER

FIELD OF THE INVENTION

The invention is generally related to differential circuit arrangements, and in particular to differential voltage level shifters.

BACKGROUND OF THE INVENTION

Level shifting is commonly required in integrated circuit designs to shift the level of a signal between different voltage domains. Differential level shifters, for example, are commonly used to shift the common mode voltage of a differential input signal to either a higher or a lower voltage that is required for a particular circuit that will be processing the differential input signal.

Particularly given the continued demand for faster circuit performance, differential level shifters, like other circuits, desirably must operate with as little rise and fall delay as possible. In many memory interfaces, for example, circuit delays must be minimized to the extent possible to maximize data transfer speeds. Differential level shifters are often used in memory interfaces, for example, to level shift to a lower voltage than the surrounding logic circuitry to accommodate low voltage memory devices.

In conventional level shifters, contention often exists on internal nodes of the circuit during switching, as a new state often tries to overpower the current state of an internal node. When there is a large difference between the voltage supply driving the input and the voltage supply driving the output, the contention takes longer to be resolved. Also, because of this contention, conventional designs are susceptible to not switching correctly in the event of an NFET/PFET device strength mismatch. A weak field effect transistor (FET) may not be able to overcome a stronger FET when attempting to switch, leaving internal nodes in an unknown state.

Therefore, a need exists in the art for an improved differential level shifter with reduced contention on internal nodes and less susceptibility to device strength mismatches.

SUMMARY OF THE INVENTION

The invention addresses these and other problems associated with the prior art by providing a design for a high speed differential voltage level shifter circuit arrangement that utilizes both PFETs and NFETs controlled by inputs to determine the state of the outputs, which minimizes or eliminates contention on internal nodes when switching from one state to another. As a result, the design minimizes the adverse affects of mismatched NFET and PFET device strengths, and facilitates usage at high frequencies and for level shifting to a range of output voltage levels. The design is also adaptable for use in level shifting to higher or lower output voltages.

In particular, consistent with one aspect of the invention, a circuit arrangement for a differential voltage level shifter is provided that includes first and second NFET devices coupled to one another in parallel and first and second PFET devices coupled to one another in parallel. The first NFET device has a gate input configured to receive an input signal, and the second NFET device has a gate input configured to receive an inverted input signal. The first PFET device has a gate input configured to receive the input signal, and the second PFET device has a gate input configured to receive the inverted input signal. The circuit arrangement also includes a first transistor device coupled in series with the first and second NFET devices and coupled to a first power signal, and a second transistor device coupled in series with the first and second PFET devices and coupled to the first power signal. Each of the first and second transistor devices has a gate input configured to receive a bias signal. The circuit arrangement further includes a first load coupled intermediate a second power signal and the first NFET and second PFET devices, a second load coupled intermediate the second power signal and the second NFET and first PFET devices, and first and second outputs coupled respectively to the first and second loads.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Embodiments consistent with the invention utilize a differential level shifter design that incorporates both PFETs and NFETs controlled by inputs to determine the state of the outputs, which minimizes or eliminates contention on internal nodes when switching from one state to another. As a result, the design minimizes the adverse affects of mismatched NFET and PFET device strengths, and facilitates usage at high frequencies and for level shifting to a range of output voltage levels. In contrast to conventional level shifters, where contention often exists on internal nodes during switching, and where the effects of mismatched device strengths can affect circuit reliability, embodiments consistent with the invention are able to operate in a manner similar to a differential amplifier, in that the state of the inputs merely steers current between two loads, with little or no real contention. Consequently, embodiments consistent with the invention are typically able to operate at much higher frequencies reliably than in conventional designs.

Figure 1:
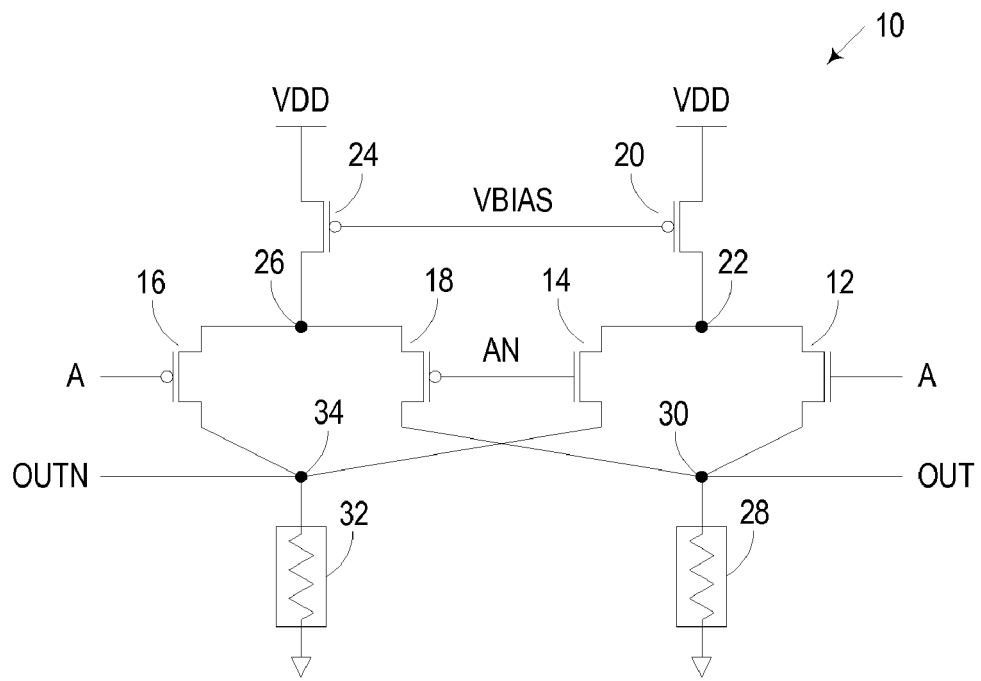
FIG. 1 is a schematic diagram of a differential level shifter circuit arrangement consistent with the invention, configured to shift an input voltage to a higher output voltage.

Turning now to the drawings, wherein like numbers denote like parts throughout the several views, FIG. 1 illustrates a differential level shifter circuit arrangement 10 consistent with the invention. Circuit arrangement 10 is configured to level shift the common mode voltage of an input signal A to a lower output voltage. An inverted input AN is also provided to the circuit, with the outputs of the circuit being OUT and OUTN (the inverted output).

Circuit arrangement 10 includes first and second NFET devices 12, 14 coupled to one another in parallel, as well as first and second PFET devices 16, 18 also coupled to one another in parallel. The gate inputs of NFET device 12 and PFET device 16 are configured to receive the input signal A, and the gate inputs of NFET device 14 and PFET device 18 are configured to receive the inverted input signal AN.

A PFET device 20 is coupled in series with the parallel arrangement of NFET devices 12, 14 at an internal node 22. Likewise, another PFET device 24 is coupled in series with the parallel arrangement of PFET devices 16, 18 at an internal node 26. Each of PFET devices 20, 24 couples the respective internal node 22, 26 to a first power signal, here positive voltage VDD, and the gate of each device 20, 24 is coupled to a bias voltage VBIAS. VBIAS is typically tied to a fixed voltage reference to bias PFET devices 20, 24 into active states. In addition, it will be appreciated that devices other than PFETs (e.g., other types of transistors) may be used in lieu of PFET devices 20, 24.

Circuit arrangement 10 also includes output nodes 30, 34 respectively coupled to the OUT output and OUTN inverted output. Node 30 couples NFET device 12 and PFET device 18 to ground via an intermediate load 28. Likewise, node 34 couples NFET device 14 and PFET device 16 to ground via an intermediate load 32. Each load 28, 32 may be passive (e.g., a resistor) or active (e.g., a transistor). An active load, for example, could be used to provide a variable impedance for the circuit.

In use, the inverted input signal AN may be configured to receive an inverted representation of the input signal A. In the alternative, AN may be tied to a fixed voltage equal to one half the voltage rail, e.g., 0.9 VDC for a 1.8 VDC rail. With VBIAS set to a level suitable for turning on PFET devices 20, 24, whenever A is greater than AN, NFET device 12 and PFET device 18 will be stronger than NFET device 14 and PFET device 16, and will thus steer current through load 28, and effectively raise the voltage at node 30 and output OUT. Whenever A is less than AN, the converse is true. NFET device 14 and PFET device 16 will be stronger than NFET device 12 and PFET device 18, and will thus steer current through load 32, raising the voltage at node 34 and inverted output OUTN. Of note, by having both an NFET device and a PFET device coupled to each node 30, 34, mismatches between device strengths do not cause contention in the internal nodes of the circuit arrangement.

Figure 2:
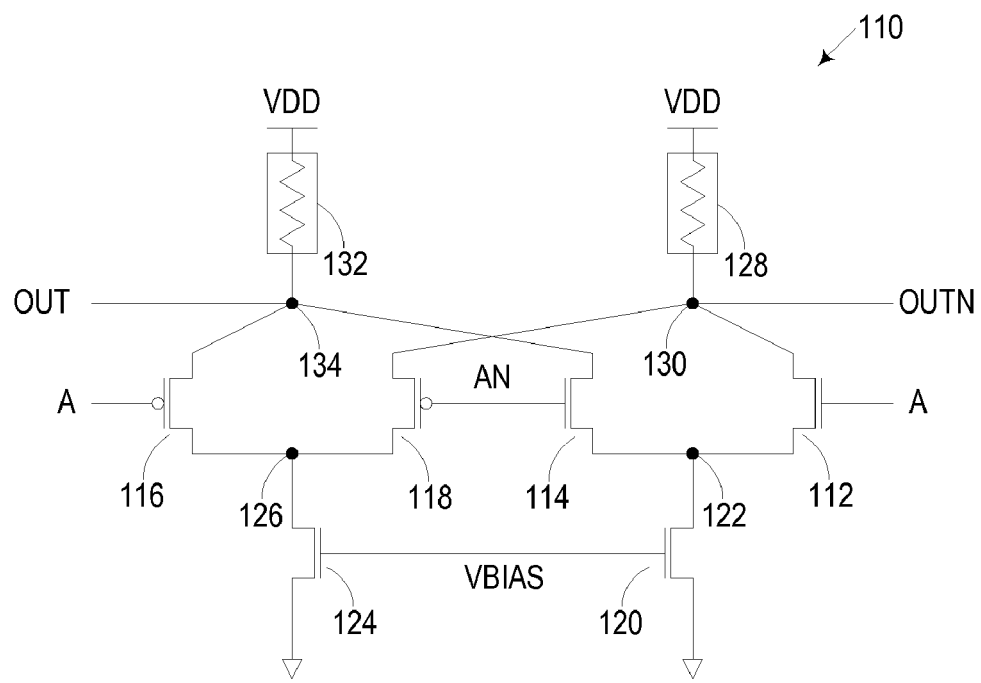
FIG. 2 is a schematic diagram of another differential level shifter circuit arrangement consistent with the invention, configured to shift an input voltage to a lower output voltage.

As noted above, a differential level shifter consistent with the invention may be utilized to level shift to higher output voltages as well as lower output voltages. FIG. 2, for example, illustrates a circuit arrangement 110 that may be used to level shift to a higher output voltage. Similar to circuit arrangement 10, circuit arrangement 110 includes first and second NFET devices 112, 114 coupled to one another in parallel, as well as first and second PFET devices 116, 118 also coupled to one another in parallel. The gate inputs of NFET device 112 and PFET device 116 are configured to receive the input signal A, and the gate inputs of NFET device 114 and PFET device 118 are configured to receive the inverted input signal AN.

An NFET device 120 is coupled in series with the parallel arrangement of NFET devices 112, 114 at an internal node 122. Likewise, another NFET device 124 is coupled in series with the parallel arrangement of PFET devices 116, 118 at an internal node 126. The gate inputs of NFET devices 120, 124 are likewise coupled to VBIAS, but unlike in circuit arrangement 10, each of NFET devices 120, 124 couples the respective internal node 122, 126 to ground.

Circuit arrangement 110 also includes output nodes 130, 134 respectively coupled to the OUT output and OUTN inverted output. Node 130 couples NFET device 112 and PFET device 118 to positive power VDD via an intermediate load 128. Likewise, node 134 couples NFET device 114 and PFET device 116 to VDD via an intermediate load 132.

In use, circuit arrangement 110 operates in a similar manner to circuit arrangement 10, steering current through either load 128 or 132 based upon whether A is greater than AN. With each load tied to VDD, however, the common mode voltage at OUT and OUTN is pulled up, rather than down.

It will be appreciated that parameters such as the common mode voltage of the outputs, and the differential voltage swing, may be controlled based upon the load and the sizes of the active devices in each circuit arrangement. In addition, it will be appreciated that, if a rail-to-rail output is desired, the OUT and OUTN outputs may be passed through suitable buffers.

Various modifications may be made to the illustrated embodiments. For example, as noted above, active or passive loads may be used, and devices other than PFETs or NFETs may be used to provide current through the parallel arrangements of NFETs and PFETs. In addition, the inverted input AN may be tied to a fixed reference voltage, or may be a true inverse of the input A. Embodiments consistent with the invention may also be used to accommodate differing input voltages, e.g., whenever it is desirable to use a particular circuit design for different voltage domains.

Various additional modifications may be made to the illustrated embodiments without departing from the spirit and scope of the invention. Therefore, the invention lies in the claims hereinafter appended.

What is claimed is:

1. A circuit arrangement for a differential voltage level shifter, comprising:
   first and second NFET devices coupled to one another in parallel, the first NFET device having a gate input configured to receive an input signal, and the second NFET device having a gate input configured to receive an inverted input signal;
   first and second PFET devices coupled to one another in parallel, the first PFET device having a gate input configured to receive the input signal, and the second PFET device having a gate input configured to receive the inverted input signal;
   a first transistor device coupled in series with the first and second NFET devices and coupled to a first power signal, the first transistor device having a gate input configured to receive a bias signal;
   a second transistor device coupled in series with the first and second PFET devices and coupled to the first power signal, the second transistor device having a gate input configured to receive the bias signal;
   a first load coupled intermediate a second power signal and the first NFET and second PFET devices;
   a second load coupled intermediate the second power signal and the second NFET and first PFET devices; and
   first and second outputs coupled respectively to the first and second loads.

2. The circuit arrangement of claim 1, wherein in the differential voltage level shifter is configured to shift a voltage present on the input signal to a lower voltage.

3. The circuit arrangement of claim 2, wherein the first power signal comprises a positive supply signal, the second power signal comprises a ground signal, the first and second transistor devices each comprise a PFET device, the first output is configured to output an output signal and the second output is configured to output an inverted output signal.

4. The circuit arrangement of claim 1, wherein in the differential voltage level shifter is configured to shift a voltage present on the input signal to a higher voltage.

5. The circuit arrangement of claim 4, wherein the first power signal comprises a ground signal, the second power signal comprises a positive supply signal, the first and second transistor devices each comprise an NFET device, the second output is configured to output an output signal and the first output is configured to output an inverted output signal.

6. The circuit arrangement of claim 1, wherein the first and second loads each comprise a passive load.

7. The circuit arrangement of claim 1, wherein the first and second loads each comprise an active load.

8. The circuit arrangement of claim 1, further comprising first and second buffers respectively coupled to the first and second outputs.

9. The circuit arrangement of claim 1, wherein the first NFET device and the first PFET device have mismatched strengths.

* * * * *